United States Patent
Tang et al.

(10) Patent No.: US 7,459,931 B1
(45) Date of Patent: *Dec. 2, 2008

(54) PROGRAMMABLE LOGIC DEVICES WITH TRANSPARENT FIELD RECONFIGURATION

(75) Inventors: Howard Tang, San Jose, CA (US); Henry Law, Los Altos, CA (US); David L. Rutledge, Hillsboro, OR (US); Om P. Agrawal, Los altos, CA (US); Fabiano Fontana, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/398,437

(22) Filed: Apr. 5, 2006

(51) Int. Cl.
*H03K 19/177* (2006.01)

(52) U.S. Cl. .......................... 326/38; 326/40
(58) Field of Classification Search ............. 326/37–41, 326/47, 101
See application file for complete search history.

(56) References Cited

U.S. PATENT DOCUMENTS

| | | | |
|---|---|---|---|
| 5,548,228 A | 8/1996 | Madurawe | |
| 5,640,107 A | 6/1997 | Kruse | |
| 5,689,516 A | 11/1997 | Mack et al. | |
| 5,696,455 A * | 12/1997 | Madurawe | 326/41 |
| 5,844,422 A | 12/1998 | Trimberger et al. | |
| 6,049,222 A | 4/2000 | Lawman | |
| 6,150,837 A | 11/2000 | Beal et al. | |
| 6,208,162 B1 * | 3/2001 | Bocchino | 326/38 |
| 6,304,099 B1 | 10/2001 | Tang et al. | |
| 6,356,107 B1 | 3/2002 | Tang et al. | |
| 6,467,009 B1 | 10/2002 | Winegarden et al. | |
| 6,507,211 B1 | 1/2003 | Schultz et al. | |
| 6,538,468 B1 * | 3/2003 | Moore | 326/40 |
| 6,704,850 B1 | 3/2004 | Reynolds | |
| 6,714,041 B1 | 3/2004 | Darling et al. | |
| 6,721,840 B1 | 4/2004 | Allegrucci | |
| 6,732,263 B1 | 5/2004 | May et al. | |
| 6,774,668 B1 | 8/2004 | Wirtz, II | |
| 6,828,823 B1 * | 12/2004 | Tsui et al. | 326/40 |
| 6,851,047 B1 | 2/2005 | Fox et al. | |
| 6,873,177 B1 * | 3/2005 | Wennekamp et al. | 326/8 |

(Continued)

OTHER PUBLICATIONS

Lattice Semiconductor Corporation, LatticeXP Family Data sheet, Version 01.0, Feb. 2005, 77 pages.

(Continued)

*Primary Examiner*—Rexford Barnie
*Assistant Examiner*—Thienvu V Tran
(74) *Attorney, Agent, or Firm*—MacPherson Kwok Chen & Heid LLP (57) ABSTRACT

Systems and methods are disclosed herein to provide reconfiguration techniques for PLDs. For example, in accordance with an embodiment of the present invention, a programmable logic device includes logic blocks, input/output blocks, a volatile memory block, and configuration memory cells to store configuration data for configuration of the logic blocks, the input/output blocks, and the volatile memory block of the programmable logic device. The programmable logic device further includes circuit techniques for preventing loss of data stored in the volatile memory block due to a reconfiguration. Furthermore, for example, the programmable logic device may further prevent the loss of data stored in user registers or loss of input/output personality due to the reconfiguration.

21 Claims, 10 Drawing Sheets

U.S. PATENT DOCUMENTS

| | | | |
|---|---|---|---|
| 7,099,227 B1* | 8/2006 | Zhou | 365/230.03 |
| 7,180,776 B1* | 2/2007 | Wennekamp et al. | 365/185.04 |
| 2002/0163840 A1* | 11/2002 | Hiraki et al. | 365/189.05 |
| 2004/0025086 A1* | 2/2004 | Gorday et al. | 714/37 |
| 2005/0083743 A1* | 4/2005 | Andrei et al. | 365/202 |
| 2005/0189962 A1 | 9/2005 | Agrawal et al. | |
| 2005/0248364 A1* | 11/2005 | Vadi et al. | 326/39 |
| 2006/0067102 A1* | 3/2006 | Yamada et al. | 365/145 |

OTHER PUBLICATIONS

Altera®, Max II Device Handbook, http://www.altera.com, M115V1-1.7, 330 pages, no date.

Actel Corporation, ProASICE Flash Family FPGAs, ARM7™ Soft IP Support in ProASIC3E ARM7-Ready Devices, Oct. 2005, 166 pages.

U.S. Appl. No. 10/809,658, Howard Tang.

U.S. Appl. No. 11/243,255, Howard Tang.

U.S. Appl. No. 11/293,941, Howard Tang.

U.S. Appl. No. 11/350,436, Howard Tang.

Lattice Semiconductor Corporation, ispXP™ Configuration Usage Guidelines, Technical Notes TN1026, Aug. 2002, pp. 1-18.

Lattice Semiconductor Corporation, ispXPGA™ Family, Preliminary Data Sheet, Sep. 2003, pp. 1-112.

Lattice Semiconductor Corporation, ispXPGA™ Family, Dec. 2002, pp. 1-90.

Xilinx, On the Fly Reconfiguration with CoolRunner-II CPLDs, Application Note: CoolRunner-II CPLDs, May 15, 2003, pp. 1-10.

Actel Corporation, "ProASIC$^{Plus}$ Flash Family FPGAs", v.3.4 Dec. 2003, pp. i-iv and I-I-1-64 & 2-1-2.67 & 2-1-2-7 (list of changes).

U.S. Appl. No. 11/397,985, filed Apr. 5, 2006, Fontana et al.

Lattice Semiconductor Corporation, LatticeXP Family Data Sheet, Version 01.0, Feb. 2005, 77 pages.

Altera R, Max II Device Handbook, http://www.altera.com, M115V1-1.7, 330 pages.

Actel Corporation, ProASICE Flash Family FPGAs, ARM7™ Soft IP Support in ProASIC3E ARM7-Ready Devices, Oct. 2005, 166 pages.

* cited by examiner

FIG. 15

PROGRAMMABLE LOGIC DEVICES WITH TRANSPARENT FIELD RECONFIGURATION

TECHNICAL FIELD

The present invention relates generally to electrical circuits and, more particularly, to reconfiguration of programmable logic devices.

BACKGROUND

A programmable logic device, such as field programmable gate array (FPGA) or a complex programmable logic device (CPLD), may be used in a variety of applications. A programmable logic device (PLD) offers the advantage of being reprogrammable in the field (e.g., while on the circuit board in its operational environment).

A drawback of a conventional PLD is that, while being programmed (which may take seconds to load an external configuration bitstream), the PLD enters a sleep state, with its input and output pins typically disabled (e.g., non-responsive to input signals while providing indeterminate output signals). If the PLD is in a critical path or is used to control critical functions, these drawbacks may be unacceptable. Furthermore, data stored in user registers or in memory blocks (e.g., volatile embedded RAM blocks) is generally lost during the programming process. As a result, there is a need for improved programming and configuration techniques for PLDs.

SUMMARY

In accordance with one embodiment of the present invention, a programmable logic device includes a plurality of logic blocks; a plurality of input/output blocks; configuration memory cells adapted to store first configuration data for configuration of the logic blocks and the input/output blocks of the programmable logic device; volatile memory adapted to store data within the programmable logic device; and a circuit adapted to preserve the data for the volatile memory during a reconfiguration of the programmable logic device.

In accordance with another embodiment of the present invention, a programmable logic device includes a plurality of logic blocks; an input/output block; a volatile memory block adapted to store data within the programmable logic device; configuration memory cells adapted to store first configuration data for configuration of the logic blocks, the input/output blocks, and the volatile memory block of the programmable logic device; and means for preventing loss of data stored in the volatile memory block due to a reconfiguration.

In accordance with another embodiment of the present invention, a method of reconfiguring a programmable logic device includes reconfiguring the programmable logic device; and preserving at least one data value of a volatile memory during the reconfiguring.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
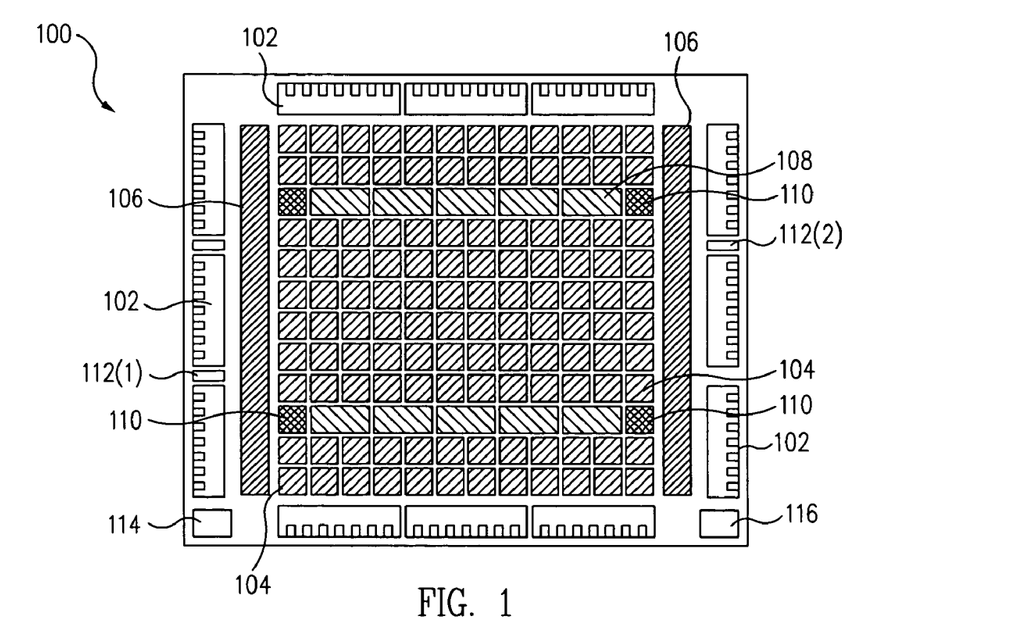
FIG. 1 shows a block diagram illustrating an exemplary programmable logic device in accordance with an embodiment of the present invention.

FIG. 1 shows a block diagram illustrating an exemplary programmable logic device (PLD) 100 in accordance with an embodiment of the present invention. PLD 100 includes input/output (I/O) blocks 102 and programmable logic blocks 104 (e.g., also referred to in the art as configurable logic blocks or logic array blocks). I/O blocks 102 provide I/O functionality (e.g., supports one or more I/O and/or memory interface standards) for PLD 100. Logic blocks 104 provide logic functionality for PLD 100, such as LUT-based logic typically associated with FPGAs or array-based logic typically associated with CPLDs.

PLD 100 may also include non-volatile memory 106 (e.g., EEPROM or flash memory), volatile memory 108 (e.g., block SRAM), clock-related circuitry 110 (e.g., PLL circuits), one or more data ports 112, configuration memory 114, and/or an interconnect 116. It should be understood that the number and placement of the various elements, such as I/O blocks 102, logic blocks 104, non-volatile memory 106, volatile memory 108, clock-related circuitry 110, data port 112, configuration memory 114, and interconnect 116, is not limiting and may depend upon the desired application. Furthermore, it should be understood that the elements are illustrated in block form for clarity and that certain elements, such as configuration memory 114 and interconnect 116, would typically be distributed throughout PLD 100 to perform their conventional functions (e.g., storing configuration data that configures PLD 100 and providing routing resources, respectively).

Data port 112 may be used for programming PLD 100, for example as explained further herein. For example, data port 112(1) may represent a programming port such as a central processing unit (CPU) port, also referred to as a peripheral data port or a sysCONFIG programming port. Data port 112 (2) may represent, for example, a programming port such as a joint test action group (JTAG) port by employing standards such as Institute of Electrical and Electronics Engineers (IEEE) 1149.1 or 1532 standards. Data ports 112(1) and 112(2) are not both required, but one or the other may be included as a port to receive configuration data and commands.

Non-volatile memory 106 may be used to store configuration data within PLD 100 for transfer to configuration memory 114 of PLD 100 upon power up or during reconfiguration of PLD 100. This may drastically reduce the time to reconfigure PLD 100 relative to an external bitstream (e.g., reduce the time from seconds to microseconds for loading of configuration data into configuration memory 114).

Non-volatile memory 106 may also be used to provide background programming and/or storage for PLD 100 in accordance with some embodiments of the present invention. For example for storage functionality, non-volatile memory 106 may be used to store data (e.g., the data values) from volatile memory 108 and/or other types of memory (e.g., user registers within PLD 100) during the reconfiguration process. Thus as an example, the values of the data stored by volatile memory 108 within PLD 100, just prior to reconfiguration, may be preserved in non-volatile memory 106 during the reconfiguration process and then written back into volatile memory 108 prior to returning to user mode, as explained further herein.

For example for background programming, PLD 100 may remain in user mode, based on the configuration data stored in configuration memory 114 within PLD 100, while non-volatile memory 106 is programmed with new configuration data (e.g., a new user defined pattern). Once the new configuration data is stored in non-volatile memory 106, this data can be transferred from non-volatile memory 106 to configuration memory 114 to reconfigure PLD 100, a process sometimes referred to as refresh. As explained further herein, the refresh process can be initiated by a signal or instruction provided to data port 112 (e.g., pulsing data port 112(1) or providing a JTAG refresh instruction via data port 112(2)).

Figure 2:
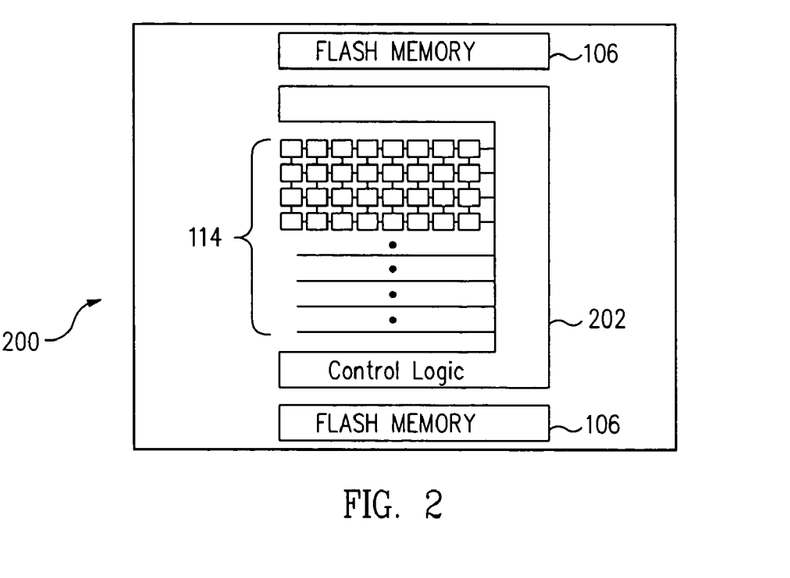
FIG. 2 shows a block diagram illustrating exemplary implementation details for the programmable logic device of FIG. 1 in accordance with an embodiment of the present invention.

As a specific example, FIG. 2 shows a block diagram illustrating a PLD 200, which provides exemplary implementation details for PLD 100 of FIG. 1 in accordance with an embodiment of the present invention. PLD 200 includes non-volatile memory 106 (e.g., flash memory), configuration memory 114, and control logic 202.

Configuration memory 114 (e.g., volatile SRAM cells or other types of volatile or non-volatile memory) are used in a conventional manner to store configuration data, which determines the user defined functions of PLD 200 (e.g., determines programmable functions of I/O blocks 102, logic blocks 104, and interconnect 116). Control logic 202 controls the internal transfer of the configuration data from non-volatile memory 106 to configuration memory 114, as would be understood by one skilled in the art.

It should be understood that flash memory represents an exemplary type of memory for non-volatile memory 106, but other types of non-volatile memory (e.g., EECMOS) that can be reprogrammed once or repeatedly may be substituted for non-volatile memory 106. Furthermore, either non-volatile memory 106 or configuration memory 114 may be programmed (i.e., receive and store information in its memory) to store configuration data for PLD 200, but the device functionality of PLD 200 is determined by the information stored in configuration memory 114. Thus, PLD 200 is configured (including reconfiguration or partial reconfiguration) when information is programmed into configuration memory 114.

It should also be understood, in accordance with one or more embodiments of the present invention, that non-volatile memory 106 and configuration memory 114 may each be programmed (including reprogrammed), for example, via data port 112(1) or data port 112(2), depending upon the desired application or design requirements. Further details regarding programming may be found in U.S. Pat. No. 6,828,823 and U.S. Patent Publication No. 2005-0189962-A1, published Sep. 1, 2005.

In general, during programming of configuration memory 114 and reconfiguration of the PLD (e.g., PLD 100), it would be advantageous to continue to support system operation functions. However, conventional approaches typically used an external bitstream to provide the configuration data directly to the configuration memory of the PLD, while the PLD's output signals are tri-stated or held to logical high or low values. Additionally for conventional approaches, any information stored in volatile memory 108 and other information (e.g., data stored in user registers of a user programmable logic area) are not saved and are lost during the reconfiguration process. Furthermore during the reconfiguration process, an I/O block's personality is not maintained (e.g., an I/O block's buffers are not preserved as LVDS, but may revert to some default state such as LVCMOS), where the personality refers to the programmable characteristics of the I/O block, such as for example the drive strength, signal levels, or other aspects for the type of I/O standard implemented for the configured I/O block).

In contrast, in accordance with one or more embodiments of the present invention, techniques are disclosed herein to use background programming to provide the configuration data to the PLD and, during configuration, provide desired PLD output signals that remain glitch-free during the transition from configuration to user mode of the PLD (e.g., full control of the logical values of the output signals provided by PLD 100 during the refresh process can still be provided). Furthermore, in accordance with some embodiments of the present invention and as discussed further herein, the personality of I/O blocks 102 and/or the data stored in volatile memory 108 and/or other information (e.g., data stored in user registers) may be preserved during a reconfiguration and then restored after completion of the programming of configuration memory 114 (e.g., prior to entering user mode of operation after the reconfiguration).

Figure 3:
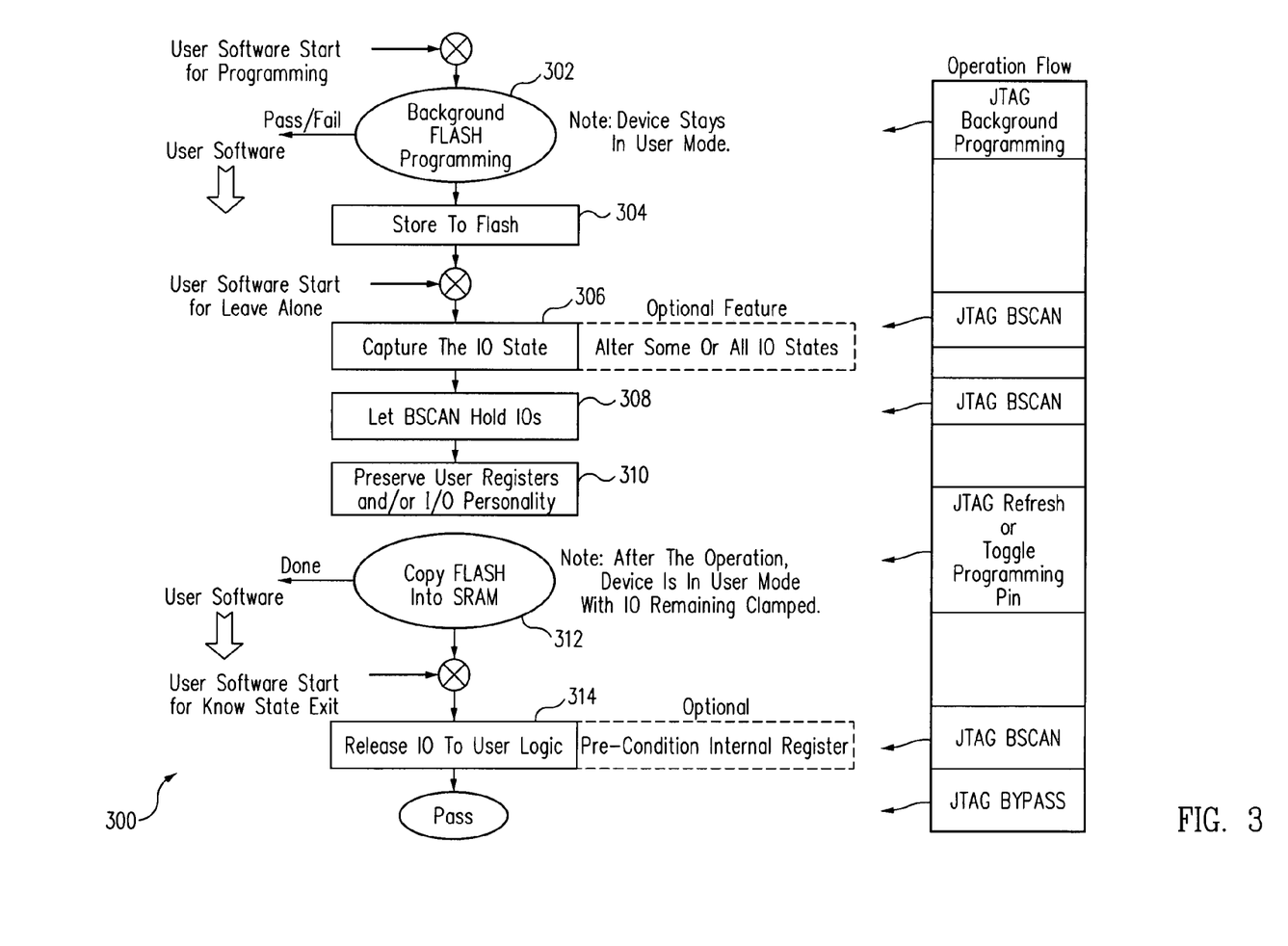
FIG. 3 shows a flowchart illustrating exemplary operations for the programmable logic device of FIG. 1 in accordance with an embodiment of the present invention.

For example, FIG. 3 shows a flowchart 300 illustrating exemplary reconfiguration operations for PLD 100 of FIG. 1 in accordance with an embodiment of the present invention. It should be understood that the various flowchart operations are note all required and some may be performed in a different order. Also as discussed further herein, the operations illustrated in flowchart 300 may be controlled by software (e.g., user software) or hardware, as illustrated in an exemplary fashion in FIG. 3 with the corresponding operational flow for the exemplary commands and the exemplary software control indicators (e.g., user software start) and/or JTAG commands.

For example, Lattice Semiconductor Corporation's ispVM software is a Windows-based tool set that facilitates the programming of their PLDs. The ispVM Embedded tool generates C code that, when compiled for and executed on a wide range of embedded processors, enables the programming of the PLDs. Consequently, the ispVM software or other conventional PLD programming software can issue the programming commands directly, such as during prototyping, or generate, for example, an industry-standard Serial Vector Format (SVF) file for reconfiguration in the field. Thus, for example, the SVF file may be used to control the various operations in flowchart 300, such as for example the background programming, store-to-flash, leave alone operation, refresh process, restore operation, and/or the known-state exit operation (e.g., create a delay period for users to apply the vectors to precondition the registers), which are described further herein.

In reference to FIG. 3, background programming is first initiated (302), while the PLD remains in user mode operation based on the current configuration data stored in configuration memory 114. For example, background programming of non-volatile memory 106 (flash memory) with the new configuration data is performed as the PLD operates based on current configuration data stored in configuration memory 114.

The background programming may be verified and then an optional store-to-flash operation (304) may be performed, which may be triggered for example by a store-to-flash control signal. For example for operation 304, data from volatile memory 108, user registers, and/or other types of memory or information within PLD 100 may be stored by non-volatile memory 106. The information stored by non-volatile memory 106 can then be returned back or restored to its original source within PLD 100, such as for example to volatile memory 108, during or after the new configuration data is written to configuration memory 114 (operation 312). Consequently, desired information within PLD 100 may be preserved while a reconfiguration is performed.

As explained further herein in accordance with some embodiments of the present invention, non-volatile memory 106 may be viewed as having a configuration flash section (e.g., to store configuration data) and a user flash section (e.g., to store and preserve data within PLD 100 (i.e., for operation 304) during the reconfiguration process). The background programming (302) may only write to the configuration flash section. Alternatively, if the background programming (302) writes over the user flash section, the store-to-flash operation (304) transfers the desired information to be preserved (e.g., data from volatile memory 108) to the user flash section and writes over the data in the user flash section provided during the background programming.

The I/O states (e.g., current I/O values, such as logical high or low, high impedance values, or sampled state) may be captured at operation 306. Optionally as part of operation 306, the I/O states may be altered as desired by a user, as explained further herein (e.g., via input paths through the boundary scan cells by manipulating pins via an external device or through JTAG).

Using the boundary scan cells at operation 308, the I/O states are held at the captured or desired values and the PLD is reconfigured or refreshed (312) by copying the configuration data from non-volatile memory 106 to configuration memory 114. The reconfiguration may be initiated, for example, by pulsing or toggling data port 112(1) or providing a JTAG instruction (Refresh) to data port 112(2).

As an alternative or in addition to using the boundary scan cells for operations 306 and 308, latches may be used as described further herein to latch and preserve the current state of one or more of the user registers at operation 310. Consequently, prior to the refresh (operation 312), the data values of the user registers may be latched while the refresh operation programs configuration memory 114. After the refresh operation (312), the user registers may be preconditioned (operation 314) by altering the register's values as desired by a user as explained further herein (e.g., via input paths through the boundary scan cells by manipulating pins via an external device or through JTAG).

Operation 310 may also optionally retain the personalities of one or more of I/O blocks 102. For example, latches may be provided to latch and retain the current personalities of one or more of I/O blocks 102, while the refresh is performed (312).

The refresh process may be verified prior to initiating the release of the I/O to the newly configured user-defined logic (operation 314). Internal registers within the I/O or other portions of the PLD may be preconditioned (314) with data to prevent glitches from occurring during the transition to user-defined logic control of the I/O (e.g., the data for preconditioning provided via input paths through the boundary scan cells). After providing the JTAG instruction (e.g., BYPASS or EXIT_EXTEST), the PLD is now configured and operating based upon the new configuration data, with the I/O output signals under control of the newly configured user logic of the PLD. Furthermore, if the internal registers were preconditioned, the logic outputs exit in the desired state determined by the inputs to the user control logic.

The techniques illustrated may also be referred to herein by the operations of "leave alone I/O" and "known-state exit." The leave alone I/O operation refers to the ability to program in background mode and, while the PLD is refreshed, hold the state of the I/O output pins in a known logic state (e.g., generally operations 302 and 306 through 312 of flowchart 300). The known state may be based on the I/O values captured or based on a known system vector that is provided to set the I/O values based on user-predefined settings. Thus, the leave alone I/O allows critical signals (e.g., reset and power enable signals provided by the PLD in a system) to not glitch and to not go active (e.g., float or provide undesired values) while the PLD is reconfigured.

The known state exit operation refers to the updating of some or all of the internal register states with predefined values (e.g., the optional portion of operation 314 of flowchart 300). The values may be provided by latches (e.g., as discussed in reference to FIG. 9) and/or via I/O pins and input paths through the boundary scan (BSCAN) cells (e.g., as discussed in reference to FIGS. 4 and 5). This operation is useful when the PLD logic that provides the value for the I/O pin may be in a state that would cause the I/O pin to pass through a glitch or inappropriate signal level (e.g., glitch or active level). Thus, the PLD exits to user-defined operation after reconfiguration in a known logic state.

Figure 4:
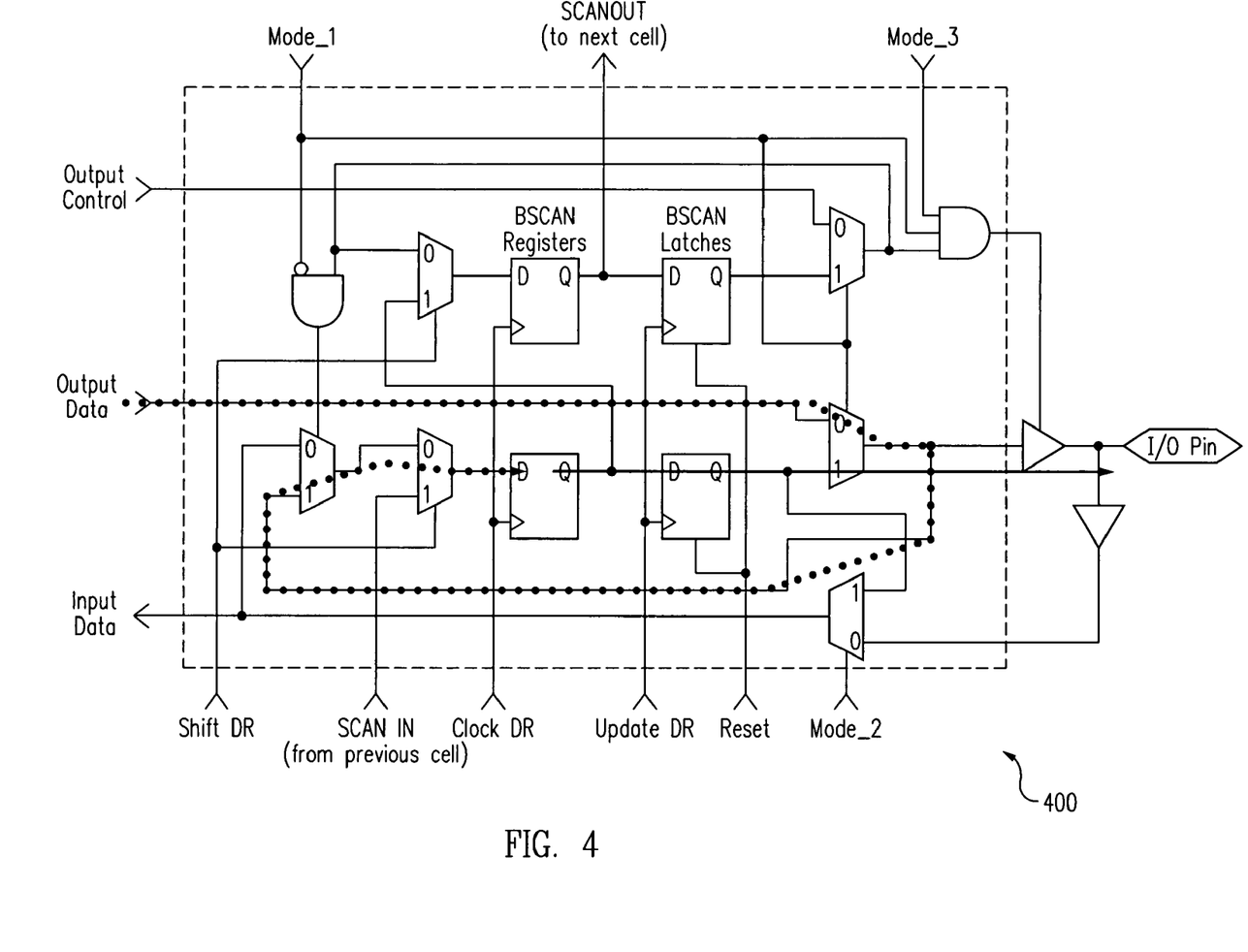
FIG. 4 shows a block diagram illustrating an exemplary circuit implementation for a portion of the programmable logic device of FIG. 1 in accordance with an embodiment of the present invention.

The leave alone operation (operations 306 and 308) may be implemented, for example, by using the BSCAN cells within the PLD to capture current I/O pin output states and/or optionally overlay with a custom I/O vector to set desired I/O pin output values. For example, FIGS. 4 and 5 show exemplary block diagram implementations for BSCAN circuits 400 and 500, respectively, for I/O blocks 102 of PLD 100 of FIG. 1 in accordance with an embodiment of the present invention.

BSCAN circuit 400 (BSCAN cell) illustrates that one or more BSCAN registers may be used to store the sampled I/O value to provide as an output signal via an I/O pin (e.g., using the JTAG instruction SAMPLE provided via data port 112(2) to place output states in BSCAN cell preload registers) and/or overlay a custom vector of user-defined values to provide as the output signal via the I/O pin (e.g., using the JTAG instruction PRELOAD). If custom vector values are provided, these can be preloaded into the PLD just prior to the refresh process (e.g., during operation 306 or 308 of flowchart 300). The I/O control can then be transferred to BSCAN circuit 400 (e.g., by using the JTAG instruction EXTEST), with the dotted path and bold arrow illustrating I/O values provided to the I/O pin based on custom vector values or captured I/O values.

BSCAN circuit 500 illustrates another exemplary circuit implementation, in accordance with an embodiment of the present invention, for a BSCAN cell. As an example, BSCAN circuit 500 shows an exemplary input path 502 via the I/O pin, where input path 502 is not blocked by BSCAN circuit 500 and is always available as an input path for providing data into the PLD (e.g., before the refresh process to provide desired I/O values or after the refresh process to precondition internal registers with desired values). Consequently, data and other information may be provided via the input path to user logic and/or registers within the PLD (e.g., to provide values for the known-state exit operation).

Figure 5:
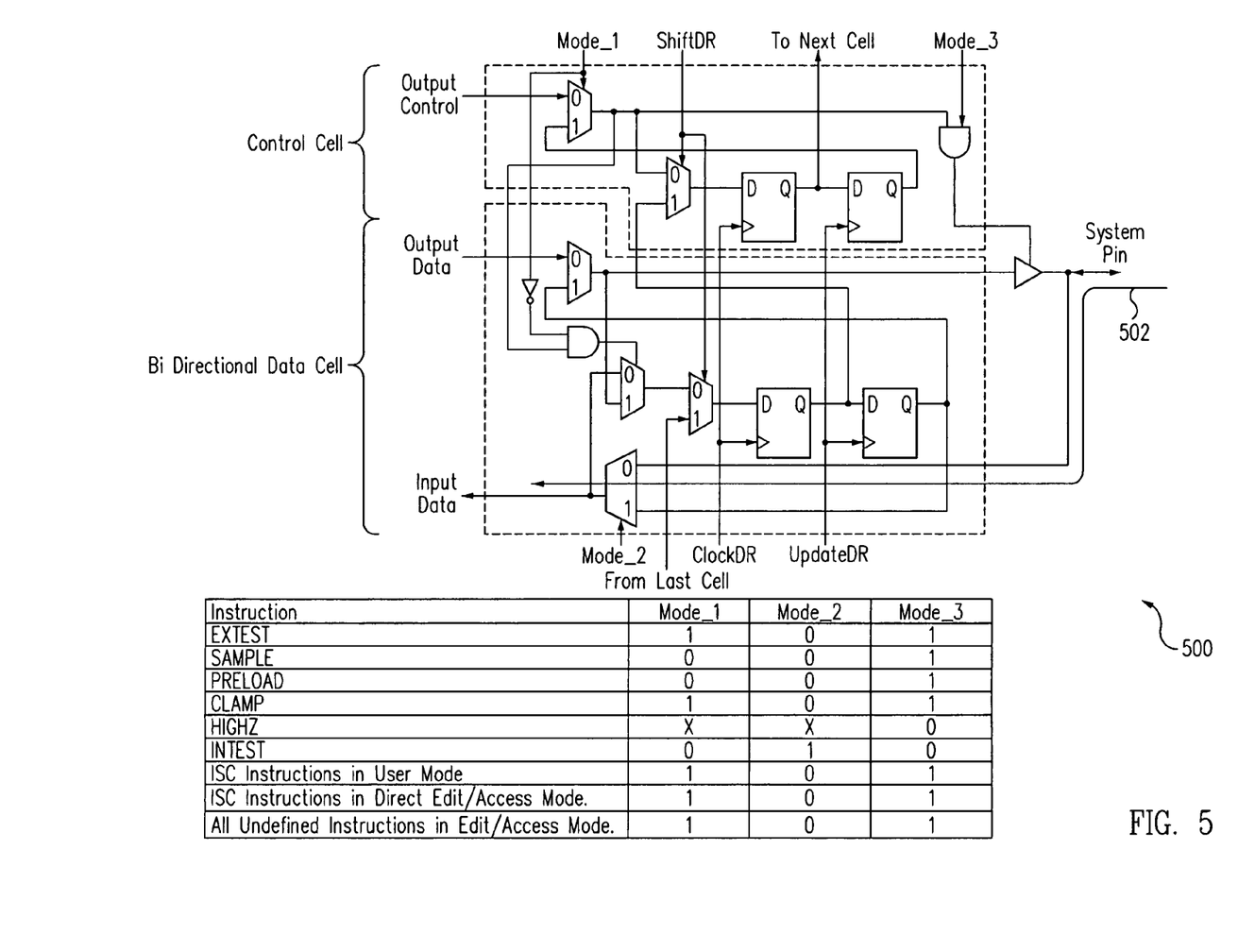
FIG. 5 shows a block diagram illustrating an exemplary circuit implementation for a portion of the programmable logic device of FIG. 1 in accordance with an embodiment of the present invention.

FIG. 5 further provides a table providing various multiplexer control signal values (e.g., for control signals Mode_1, Mode_2, and Mode_3) for corresponding JTAG instructions. Note, for example, that input path 502 is always available through a multiplexer controlled by the Mode_2 control signal for the exemplary JTAG instructions, except for the JTAG INTEST instruction. Further additional details regarding exemplary BSCAN circuits and operation may be found, for example, in U.S. Pat. Nos. 6,304,099 and 6,356,107.

Figure 6:
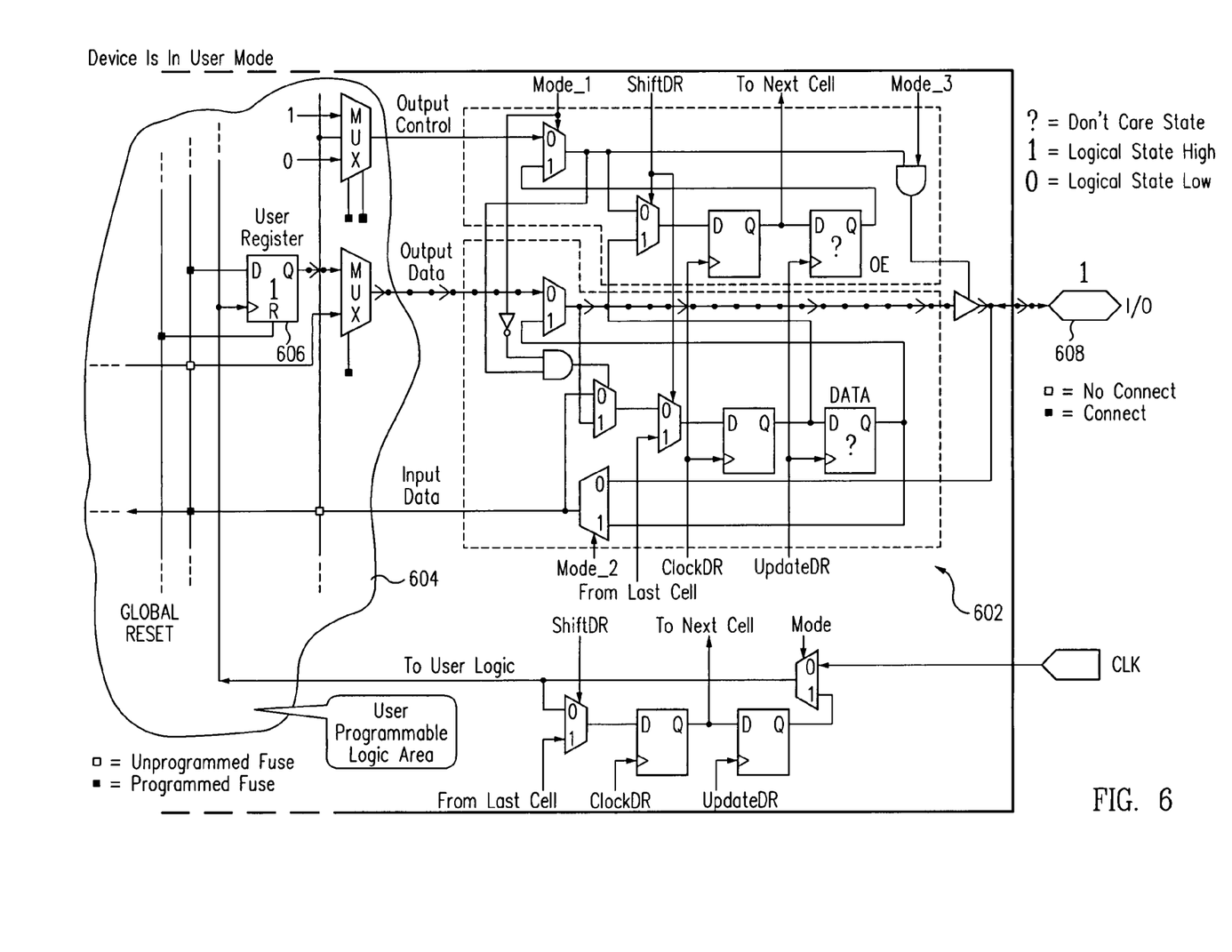
FIGS. 6-8 show block diagrams illustrating exemplary operations associated with a reconfiguration for the programmable logic device of FIG. 1 in accordance with an embodiment of the present invention.
Figure 7:
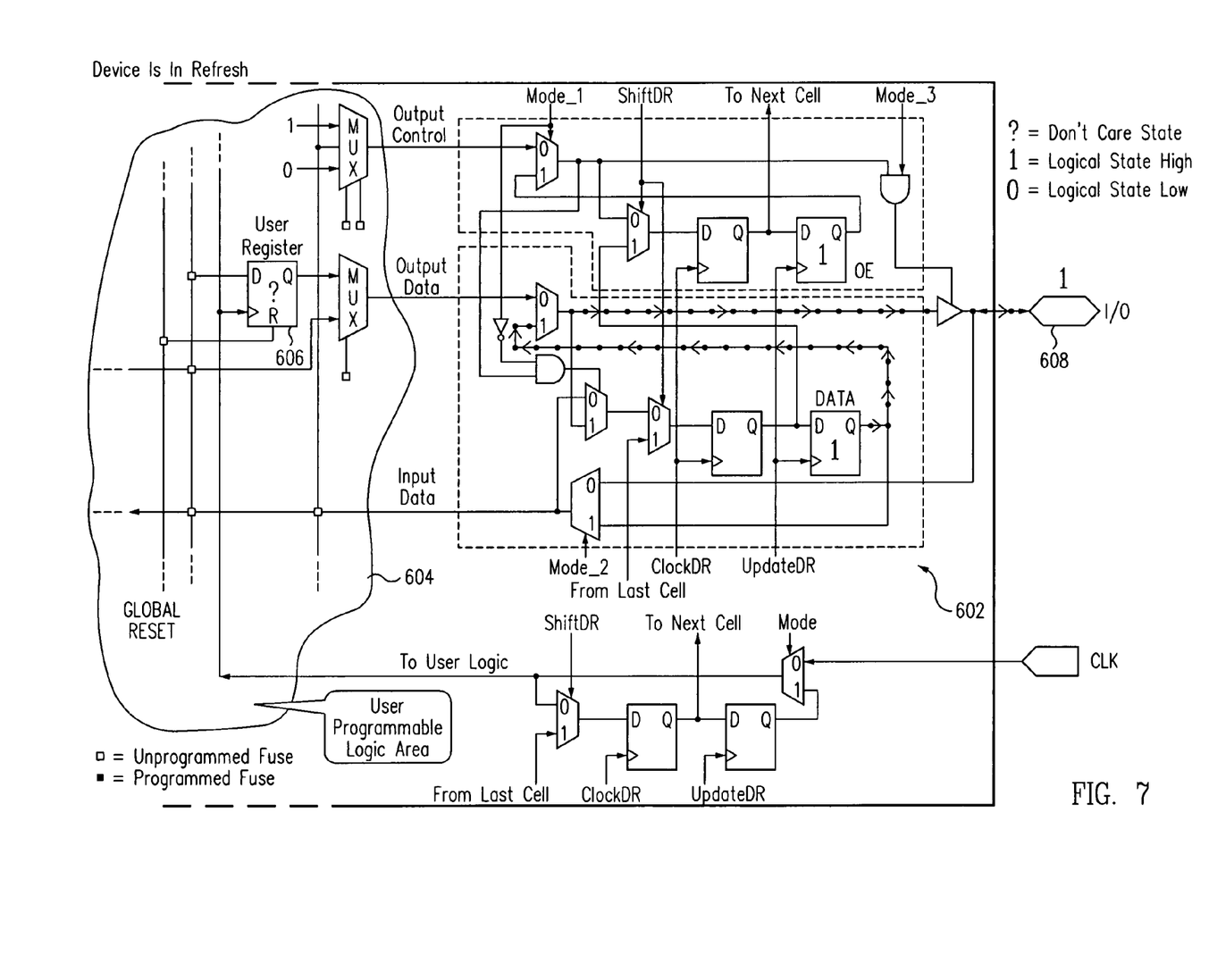
Figure 8:
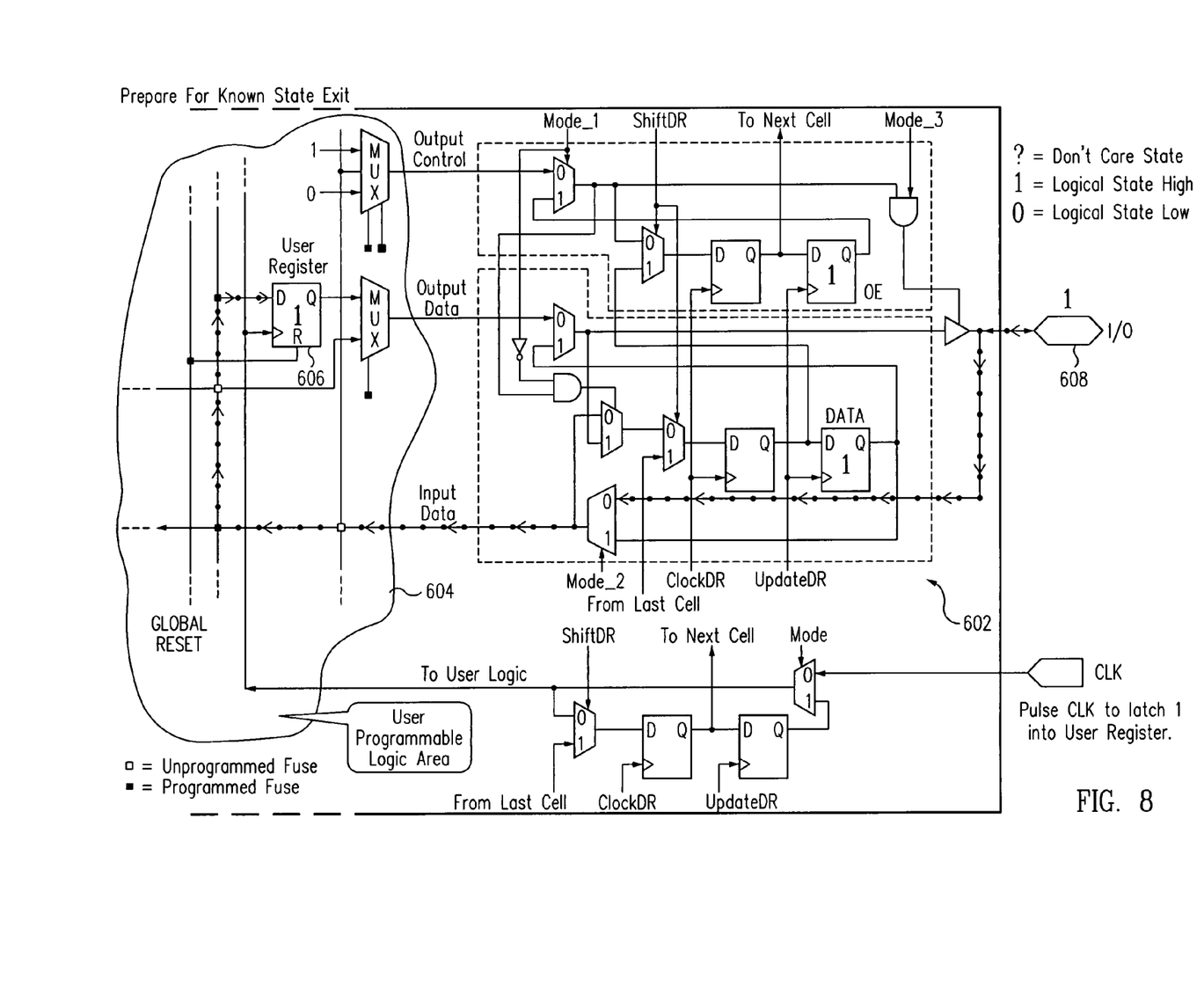

FIGS. 6-8 show block diagrams illustrating exemplary operations associated with a reconfiguration for PLD 100 of FIG. 1 in accordance with an embodiment of the present invention. Specifically, FIGS. 6-8 show an exemplary BSCAN circuit 602 (e.g., similar to BSCAN circuit 500) and a portion of a user programmable logic area 604 of PLD 100.

For example, FIG. 6 shows PLD 100 operating in a user mode of operation prior to the refresh operation. The logical states stored in BSCAN circuit 602 may be unknown (or don't care state as indicated by the question mark) and a user register 606 within logic area 604 may store a logical high value (i.e., a logical high data value "1"), which user register 606 provides to an I/O pin 608, as shown by the dotted path. It should also be noted that some fuses (e.g., configuration memory 114) may be programmed and others may not be programmed within logic area 604, as shown by the shaded and clear squares (where shaded indicates a programmed connection).

FIG. 7 shows PLD 100 during the refresh process. For this example, BSCAN circuit 602 has captured and maintained the logical high value on I/O pin 608 (as shown by the exemplary dotted path), while logic area 604 is being programmed. Thus, during the refresh operation, the fuses within logic area 604 are at some point in an un-programmed state. For example, if the fuse is for a connection, then an un-programmed fuse means no connection.

Furthermore, user register 606 in logic area 604 may not be accessible and may store an unknown data value, as shown in FIG. 7. For example, a clock signal provided to user register 606 via a clock pin (CLK) may not be externally held low to maintain the logical high value in user register 606 during the refresh operation. As another example, if the fuse connecting the reset (R) terminal of user register 606 to a global reset signal is programmed, the logical high value (i.e., a "1" data value) stored in user register 606 may be reset to a logical low value (i.e., a "0" data value) when the global reset signal is asserted during the refresh operation.

Alternatively as an example, if the global reset signal is hardwired to the reset terminal of user register 606 and the global reset signal is asserted during the refresh process, then user register 606 will store a logical low value rather than the desired logical high value. Consequently, the known-state exit operation would be required to restore the logical high value in user register 606 and avoid output signal glitches when releasing control of the I/O pin to the new user-defined logic.

FIG. 8 shows PLD 100 after the refresh process and with a known-state exit. User register 606 within logic area 604 has been preconditioned (i.e., preloaded) with a desired logical high value, as shown by the dotted input path, so that the logical high value on I/O pin 608 is maintained glitch-free when user mode of operation resumes. This is possible because the appropriate fuses within logic area 604 have been programmed by the refresh process to provide the proper connections to access user register 606 within logic area 604. Consequently, before transitioning to the user mode of operation and releasing control of I/O pin 608 to the user-defined logic, the appropriate data value may be provided via BSCAN circuit 602 to user register 606 within logic area 604. User register 606, in turn, provides the appropriate value to I/O pin 608 when the user mode of operation resumes.

Figure 9:
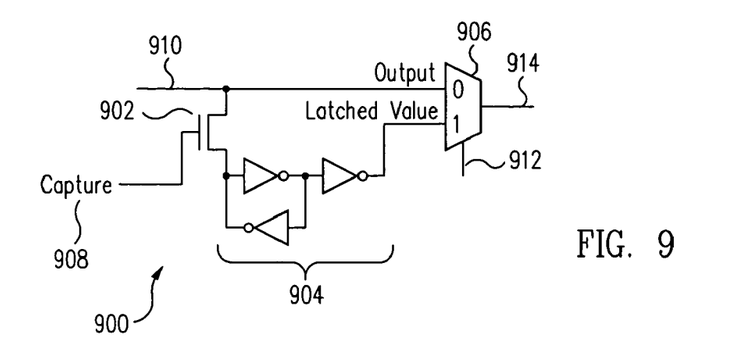
FIG. 9 shows a block diagram illustrating an exemplary circuit implementation for a latch within the programmable logic device of FIG. 1 in accordance with an embodiment of the present invention.

FIG. 9 shows a circuit 900, which illustrates an exemplary circuit implementation for a latch (also referred to herein and optionally used as a bus keeper circuit) for PLD 100 in accordance with an embodiment of the present invention. One or more of circuits 900 may be implemented within PLD 100 to store and preserve user register output values and/or retain the personality of I/O blocks 102, as described for operation 310 (FIG. 3).

Circuit 900 includes a transistor 902, a memory cell 904, and a multiplexer 906. A signal 910 may be stored by memory cell 904 by asserting (e.g., a logical high value) a capture control signal 908 to switch on transistor 902. A control signal 912 controls multiplexer 906 to select signal 910 or the stored value provided by memory cell 904 (e.g., a latch) to provide on an output signal path 914.

Signal 910 may represent a signal from one of configuration memory cells 114, a user register output signal (e.g., a Q output signal of user register 606), or some other signal whose value it is desired to acquire and preserve during the reconfiguration process (e.g., a signal (e.g., data value) from one configuration memory 114 that controls some personality aspect for I/O block 102). During the refresh (operation 312), for example, control signal 912 can be asserted to provide the latched data value on output signal path 914 to maintain a consistent output value during the refresh, and then be deasserted when desired so that signal 910 is selected by multiplexer 912 and provided on output signal path 914 after the reconfiguration has been completed.

It should also be understood that circuit 900 may be modified as desired, depending upon the desired application, as would be understood by one skilled in the art. For example, circuit 900 may include weak pull-up and pull-down resistors on output signal path 914 at the output of multiplexer 906 to maintain logical high or logical low states on output signal path 914 during programming mode. However, the weak pull-up and pull-down resistors permit the latched logic state provided by memory cell 904 to be overridden by external signals driven onto output signal path 914 if desired.

For example, external signals may be driven onto output signal path 914 to precondition registers in a logic area of PLD 100 to support the known state exit operation previously described herein. In this regard, it will be appreciated that, in various embodiments, output signal path 914 of circuit 900 (e.g., a bus keeper circuit) may be connected with input path 502 of FIG. 5 previously described herein. Thus, one or more circuits 900 may be implemented as bus keeper circuits to maintain the desired values on I/O pins during the refresh (operation 312), for example, to preserve user register values and maintain continuity from the old user configuration to the new user configuration, but would allow external input signals to be driven onto output signal path 914 to precondition registers (operation 314).

Figure 10:
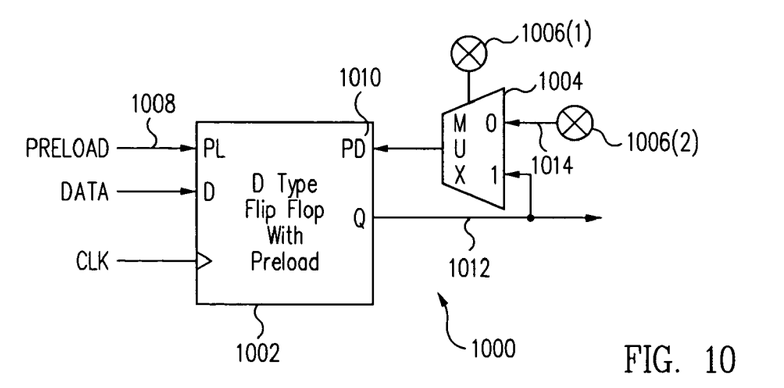
FIG. 10 shows a block diagram illustrating an exemplary circuit implementation for preserving a user register value and providing a known state exit for the programmable logic device of FIG. 1 in accordance with an embodiment of the present invention.

FIG. 10 shows a circuit 1000, which illustrates an exemplary circuit implementation for preserving a user register value and/or providing a known state exit for PLD 100 of FIG. 1 in accordance with an embodiment of the present invention. Circuit 1000 includes a user register 1002 (e.g., representing user register 606) and a multiplexer 1004, which are within PLD 100.

For this exemplary implementation, user register 1002 may represent a D-type flip flop with preload functionality. As an example, when PLD 100 enters the programming mode (to reconfigure PLD 100), a PRELOAD signal 1008 may be held high to preload data provided at a preload data (PD) terminal 1010 of user register 1002. For example, by controlling multiplexer 1004, either the current Q output signal 1012 or another data signal 1014 may be latched into user register 1002 at PD terminal 1010 as provided by multiplexer 1004. The control of multiplexer 1004 and the value of data signal 1014 may be provided, for example, by configuration memory cells 1006 (separately referenced as 1006(1) and 1006(2)), which are part of configuration memory 114.

In general, if the current value of Q output signal 1012 is stored into preload data (PD) terminal 1010, user register 1002 will provide (after reentering user mode after reconfiguration) the same value as just prior to the reconfiguration. Thus, the value provided by user register 1002 will be preserved during the reconfiguration (e.g., the register value from the previous user pattern is carried into the new pattern or may be viewed as using the user register to store the current data for the next application).

If the value stored into preload data (PD) terminal 1010 is provided by data signal 1014 (e.g., the SRAM fuse), user register 1002 will provide this user defined new value (after reentering user mode after reconfiguration). Consequently, user register 1002 will enter the user mode after the reconfiguration with a user specified state in user register 1002. Thus, in accordance with some embodiments of the present invention, this technique may be applied as desired to any number of user registers within PLD 100 to provide a known state (e.g., known state exit) from the user register when entering the user mode after a reconfiguration. Additionally in accordance with an embodiment of the present invention, this technique may be applied to provide a known state entrance such that user register 1002 is providing a known value just prior to entering reconfiguration.

Figure 11:
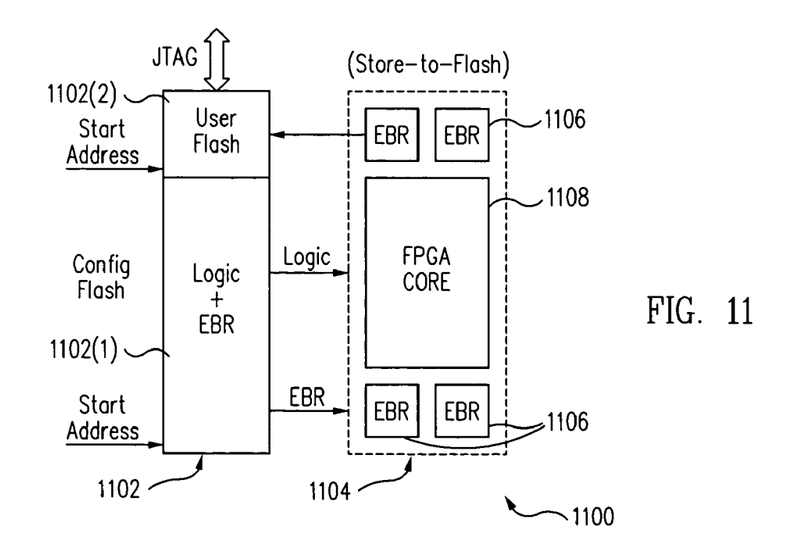
FIG. 11 shows a block diagram illustrating exemplary implementation details for the programmable logic device of FIG. 1 in accordance with an embodiment of the present invention.

FIG. 11 shows a block diagram illustrating a PLD 1100, which provides exemplary store-to-flash implementation details (e.g., operation 304 of FIG. 3) for PLD 100 of FIG. 1 in accordance with an embodiment of the present invention. PLD 1100 includes a non-volatile memory 1102, which may represent, for example, non-volatile memory 106 (FIG. 1). Non-volatile memory 1102 includes a configuration flash section 1102(1) and a user flash section 1102(2) (also referred to herein as a shadow flash section).

Configuration flash section 1102(1) is used to store configuration data for transfer to configuration memory 114 (not shown) within a PLD portion 1104 of PLD 1100 to configure PLD 1100. PLD portion 1104 includes generally core circuitry 1108 (e.g., I/O blocks 102, programmable logic blocks 104, and interconnect 116) and volatile memory blocks 1106 (e.g., representing volatile memory 108 and labeled EBR). User flash section 1102(2) is used to store data transferred from volatile memory blocks 1106 to preserve during reconfiguration and which is later transferred back to volatile memory blocks 1106 during or after the refresh (e.g., operation 312) but prior to transition to user mode of operation.

Figure 12:
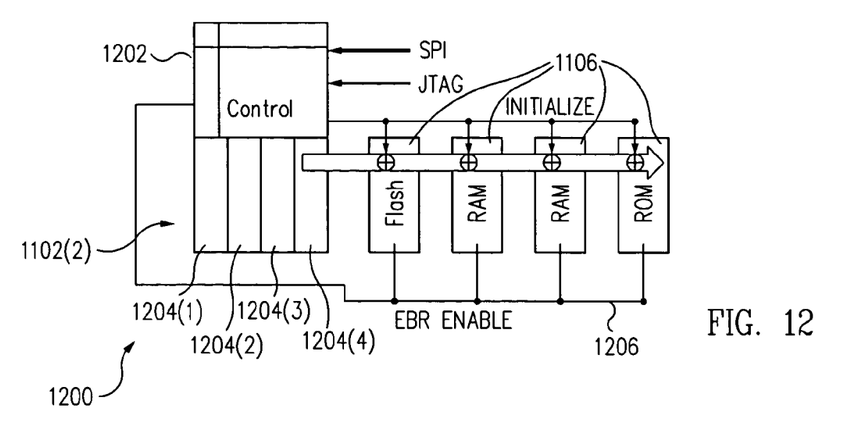
FIGS. 12-14 show block diagrams illustrating exemplary implementation details for a store-to-flash operation for the programmable logic device of FIG. 1 in accordance with an embodiment of the present invention.
Figure 13:
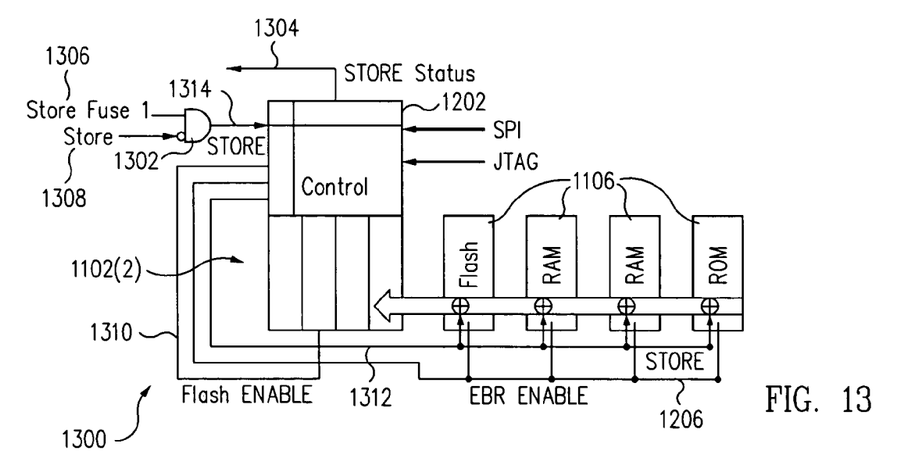
Figure 14:
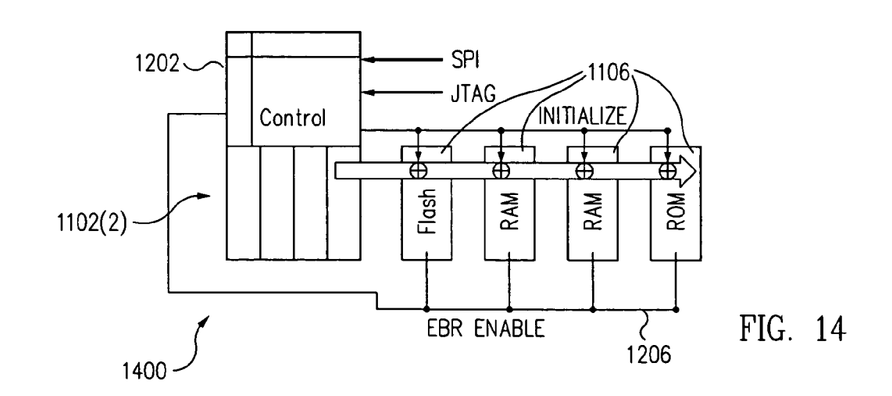

For example, FIGS. 12-14 show circuits 1200, 1300, and 1400, respectively, which illustrate exemplary implementation details for a store-to-flash operation (e.g., operation 304) for PLD 1100 of FIG. 11 (or PLD 100 of FIG. 1) in accordance with an embodiment of the present invention. FIGS. 12-14 may be viewed as illustrating generally a user programming flow of operations for user flash.

Circuit 1200 includes control logic 1202, user flash section 1102(2), and volatile memory blocks 1106. Control logic 1202, for example, may be formed as part of or separate from control logic 202 (FIG. 2). It should be noted that other circuitry, such as configuration flash section 1102(1) or programmable logic blocks 104, are not shown for clarity.

Volatile memory blocks 1106, for example, have been configured by a user pattern to function as flash memory (Flash), RAM, and ROM, as labeled in FIG. 12. User flash section 1102(2) is also illustrated in an exemplary fashion to include sections 1204(1) through 1204(4), which correspond to memory available for storage of data for the flash memory, RAM, RAM, and ROM as labeled for volatile memory blocks 1106. For example, volatile memory block 1106 that is labeled Flash is a volatile memory block (e.g., embedded block RAM or EBR) that a user desired to configure to function as flash memory. Furthermore for example, section 1204(1) is the section of user flash section 1102(2) (e.g., shadow flash) that will hold and preserve data for volatile memory block 1106 labeled flash memory during the reconfiguration for the store-to-flash operation (e.g., section 1204(1) shadows volatile memory block 1106 labeled Flash).

Circuit 1200 illustrates, with the bold arrow from user flash section 1102(2) through volatile memory blocks 1106, the ability to transfer data from user flash section 1102(2) to volatile memory blocks 1106 to initialize volatile memory blocks 1106 with desired data. For example, control logic 1202 may provide an enable signal 1206 (labeled EBR enable) to volatile memory blocks 1106 to enable volatile memory blocks 1106 to store the data provided by user flash section 1102(2). Control logic 1202 may be controlled, for example, via SPI or JTAG ports (e.g., via data port 112) during the store-to-flash operation or to initiate the store-to-flash operation.

PLD 1100 containing circuit 1200 may be viewed as operating in a user mode of operation as configured by a user pattern (i.e., a user defined pattern "A"). If a user desires to reconfigure PLD 1100, non-volatile memory 1102 may be erased (e.g., write all logical high values "1") and then a new user pattern (i.e., a user defined pattern "B") may be written to non-volatile memory 1102 (including user flash section 1102 (2)), while PLD 1100 operates in user mode with user defined pattern "A" (e.g., background programming operation 302 is performed). For example, user flash section 1102(2) may now store a default pattern (e.g., store all logical low values "0"), except for section 1204(4) corresponding to volatile memory block 1106 (labeled ROM) that a user desires to function as ROM and thus section 1204(4) stores the desired ROM data (e.g., the same ROM data as in user defined pattern "A").

Prior to performing the refresh operation (e.g., operation 312), a user may desire to preserve the data stored in volatile memory blocks 1106. Therefore, as illustrated in FIG. 13, a store-to-flash operation (e.g., operation 304) may be performed to transfer the data stored in volatile memory blocks 1106 to user flash section 1102(2) to preserve the data during the refresh. Upon completion of the store-to-flash operation for this example, section 1204(1) through 1204(4) will store the data from volatile memory blocks 1106 labeled Flash, RAM, RAM, and ROM, respectively.

For example as shown in circuit 1300, when a store-to-flash control signal 1308 is deasserted, a store control signal 1314 is provided by a logic gate 1302 (e.g., which may also be controlled by a store signal 1306 provided by an SRAM fuse programmed to a "1" value) to control logic 1202. Alternatively, the store-to-flash operation may be controlled by SPI or JTAG ports. A store status signal 1304 may be provided by control logic 1202 to indicate when the store-to-flash operation has been completed.

During the store-to-flash operation (FIG. 13), control logic 1202 may provide a store control signal 1312 to volatile memory blocks 1106 and a flash enable control signal 1310 to user flash section 1102(2) to control the transfer and storage of data from volatile memory blocks 1106 to user flash section 1102(2). Upon completion of the store-to-flash operation, the refresh operation may be performed to reconfigure PLD 1100. For example for the refresh operation, the configuration data stored in configuration flash section 1102(1) may be transferred to configuration memory 114, and the data stored and preserved in user flash section 1102(2) may be transferred to volatile memory blocks 1106 (e.g., as illustrated in FIG. 14). The refresh operation may be initiated, for example, by powering down and then powering up PLD 1100, toggling a program pin of PLD 1100, or sending a refresh command to PLD 1100 (e.g., via a slave SPI interface or JTAG port).

Figure 15:
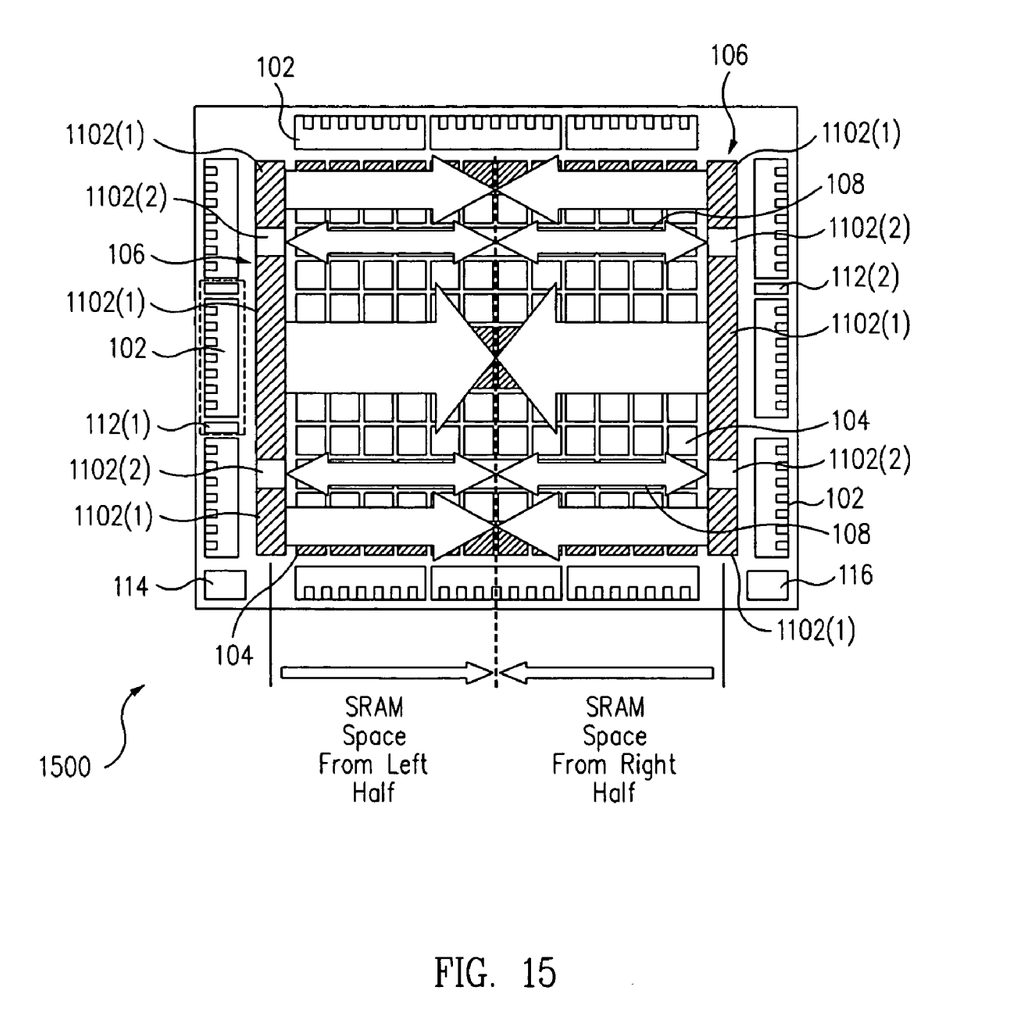
FIG. 15 shows a block diagram illustrating exemplary implementation details for the programmable logic device of FIG. 1 in accordance with an embodiment of the present invention.

FIG. 15 shows a block diagram illustrating a PLD 1500, which provides exemplary implementation details (e.g., operation 304 of FIG. 3) for the programmable logic device of FIG. 1 in accordance with an embodiment of the present invention. In general, FIG. 15 illustrates an exemplary data flow between non-volatile memory 106 (e.g., flash memory) and volatile memory 108 (e.g., EBR) and configuration memory 114 (e.g., configuration SRAM fuses). As noted herein, although configuration memory 114 is shown in block form, it should be understood that configuration memory 114 typically would be distributed within PLD 1500 in a conventional fashion to store configuration data and configure PLD 1500 for its intended purpose based on the configuration data.

Non-volatile memory 106 may be viewed in accordance with some embodiments of the present invention as including configuration flash sections 1102(1) and user flash sections 1102(2). Configuration flash sections 1102(1), which are shown as shaded portions of non-volatile memory 106 and also referred to as configuration flash, are used to store configuration data for transfer to configuration memory 114 to configure PLD 1500. This is illustrated in FIG. 15 by the single-headed arrows drawn from configuration flash sections 1102(1) to portions of PLD 1500 where configuration memory 114 would typically be distributed. For example, configuration flash sections 1102(1) on the left and right sides of PLD 1500 may be used to transfer data to configuration memory 114 on the left half and right half, respectively, of PLD 1500 as shown.

User flash sections 1102(2), which are shown as unshaded portions of non-volatile memory 106 and also referred to as user flash or EBR shadow flash, are used to store the data for volatile memory 108 and preserve the data for volatile memory 108 through a reconfiguration of PLD 1500. This is illustrated in FIG. 15 by the double-headed arrows drawn between user flash sections 1102(2) and volatile memory 108 (e.g., bi-directional operation of user flash). For example, user flash sections 1102(2) on the left and right sides of PLD 1500 may be used to transfer data to volatile memory 108 on the left half and right half, respectively, of PLD 1500 as shown. Furthermore for example, user flash sections 1102(2) on the left and right sides of PLD 1500 may be used to receive data from volatile memory 108 on the left half and right half, respectively, of PLD 1500 as shown.

Thus, the content of volatile memory 108 may be programmed back into user flash sections 1102(2), the process of which may also be referred to as a Store action (e.g., as discussed in reference to FIG. 13), to preserve data stored by volatile memory 108 prior to a reconfiguration. Consequently, user flash sections 1102(2) may be viewed, for this example, as user flash memory and as a subset of non-volatile memory 106 to provide self-programming capability.

Systems and methods are disclosed herein to provide reconfiguration techniques for PLDs. For example, in accordance with an embodiment of the present invention, techniques are disclosed to provide transparent field reconfiguration such that the PLD can be reconfigured without interrupting system operation (e.g., to provide dynamic programming of programmable devices with embedded volatile fuses (e.g., configuration SRAM) and embedded non-volatile fuses (e.g., flash memory) for a minimally disruptive reconfiguration solution for the PLD).

In general, many system designs, within which the PLD operates, require 99.999% up-time. For example, by using background programming, the PLD continues to operate while the external bitstream is loaded into non-volatile memory. The non-volatile memory can also optionally be used to preserve information, such as from the embedded block RAM, during the reconfiguration process and then restored into the corresponding memory (e.g., embedded block RAM) prior to returning to user mode of operation. Furthermore, by driving glitch-free known values as output signals via the I/O circuits, the PLD can provide valuable functionality to the system in which it operates, such as to continue to provide power enable, reset, or other critical signals (e.g., which may be used to bring up the system) while the PLD is reconfigured (e.g., in an on-the-fly reconfiguration procedure). Thus, techniques are disclosed herein to control the state of the logic within the PLD prior to exiting the configuration process, which allows the device logic to drive the correct levels on its outputs immediately and provide a known state exit and seamless transfer to user logic, when control of I/O is passed back to the PLD logic at the end of the configuration cycle.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
a plurality of logic blocks;
a plurality of registers, wherein the logic blocks and the registers are within a user programmable logic area;
a plurality of input/output blocks, wherein the plurality of input/output blocks include boundary scan cells adapted to precondition the registers with desired signal values, prior to release of control of the input/output blocks to user-defined logic provided by a reconfiguration of the programmable logic device, such that the registers provide the desired data values after the reconfiguration;

configuration memory cells adapted to store first configuration data for configuration of the logic blocks and the input/output blocks of the programmable logic device;

a volatile memory block adapted to store data within the programmable logic device; and a circuit adapted to preserve the data for the volatile memory during the reconfiguration of the programmable logic device, wherein the circuit comprises:

a non-volatile memory block adapted to store data transferred from the volatile memory block prior to the reconfiguration and return the data to the volatile memory block prior to entering user mode after the reconfiguration, wherein the non-volatile memory block is further adapted to store second configuration data and transfer the second configuration data to the configuration memory cells for the reconfiguration of the programmable logic device; and a control circuit adapted to control transfer of the data between the non-volatile memory block and the volatile memory block and further adapted to control transfer of the second configuration data to the configuration memory cells.

2. The programmable logic device of claim 1, wherein the volatile memory block comprises a user register, and wherein the circuit comprises a latch circuit adapted to capture a data value stored in the user register and provide the data value for the user register during the reconfiguration.

3. The programmable logic device of claim 1, wherein the volatile memory block comprises a user register, and wherein the circuit comprises a multiplexer adapted to selectively capture a data value stored in the user register or a second data value and provide to a preload data terminal of the user register.

4. The programmable logic device of claim 1, wherein the volatile memory block comprises one of the configuration memory cells, and wherein the circuit comprises a latch circuit adapted to capture a data value stored in the configuration memory cell and provide the data value for the configuration memory cell during the reconfiguration.

5. The programmable logic device of claim 1, wherein the volatile memory block comprises one of the configuration memory cells configured to control a personality aspect of one of the input/output blocks, and wherein the circuit comprises a latch circuit adapted to capture a data value stored in the configuration memory cell and provide the data value for the configuration memory cell during the reconfiguration.

6. The programmable logic device of claim 1, further comprising at least a first data port adapted to receive commands for controlling the reconfiguration of the programmable logic device.

7. The programmable logic device of claim 1, wherein the boundary scan cells are further adapted to capture current output values of the corresponding input/output blocks or receive values provided to the programmable logic device and provide the captured or received values as output signals from the programmable logic device during the reconfiguration of the programmable logic device.

8. A programmable logic device comprising:
a plurality of logic blocks;
a plurality of registers, wherein the logic blocks and the registers are within a user programmable logic area;
an input/output block, wherein the input/output block comprises a boundary scan cell adapted to precondition at least one of the registers with a desired signal value, prior to release of control of the input/output block to user-defined logic provided by a reconfiguration, such that the register provides the desired data value after the reconfiguration;

a volatile memory block adapted to store data within the programmable logic device;

configuration memory cells adapted to store first configuration data for configuration of the logic blocks, the input/output blocks, and the volatile memory block of the programmable logic device;

a non-volatile memory block having a first section adapted to receive data from the volatile memory block prior to the reconfiguration for transfer back to the volatile memory block prior to entering a user mode of operation after the reconfiguration, wherein the non-volatile memory block further includes a second section adapted to store second configuration data to transfer to the configuration memory cells during the reconfiguration; and a control circuit adapted to control the transfer of the data between the non-volatile memory block and the volatile memory block to save the data during the reconfiguration and to control the transfer of the second configuration data from the non-volatile memory block to the configuration memory cells to reconfigure the programmable logic device.

9. The programmable logic device of claim 8, further comprising:
a user register; and
a latch circuit adapted to capture a data value stored in the user register and provide the data value for the user register during the reconfiguration.

10. The programmable logic device of claim 8, further comprising:
a user register; and
a multiplexer circuit adapted to selectively capture a data value stored in the user register or a second data value and provide to a preload data terminal of the user register to provide the data value or the second data value from the user register after the reconfiguration.

11. The programmable logic device of claim 8, further comprising a latch circuit adapted to capture a data value stored in one of the configuration memory cells and provide the data value for the configuration memory cell during the reconfiguration to retain a personality aspect of the input/output block during the reconfiguration.

12. The programmable logic device of claim 8, wherein the boundary scan cell is further adapted to capture a current output value of the input/output block or receive a value provided to the programmable logic device and provide the captured or received value as an output signal from the programmable logic device during the reconfiguration of the programmable logic device.

13. A method of reconfiguring a programmable logic device, the method comprising:
performing a background programming operation of the programmable logic device prior to a reconfiguring;
transferring data from a volatile memory block to a non-volatile memory block prior to the reconfiguring;
transferring the data from the non-volatile memory block to the volatile memory block during the reconfiguring such that the data is available within the volatile memory block after the reconfiguring;
capturing input/output states prior to the reconfiguring to provide during the reconfiguring;
copying configuration data from the non-volatile memory block to configuration memory for the reconfiguring;
reconfiguring the programmable logic device;

preserving at least one data value of a volatile memory during the reconfiguring; and providing a desired data value to the programmable logic device to precondition a register within a user logic area of the programmable logic device, prior to release of control to user-defined logic provided by the reconfiguring, such that the register provides the desired data value after the reconfiguring.

14. The method of claim 13, wherein the volatile memory comprises a user register, and wherein the preserving comprises latching and providing the data value during the reconfiguring.

15. The method of claim 13, wherein the volatile memory comprises a user register, and wherein the preserving comprises providing the data value to a preload data terminal of the user register to provide the data value from the user register after the reconfiguring.

16. The method of claim 13, wherein the volatile memory comprises a configuration memory cell for an input/output block, and wherein the preserving retains a personality aspect of the input/output block during the reconfiguring.

17. The method of claim 13, further comprising:
    capturing current output signal values of the programmable logic device; and
    providing from the programmable logic device, during the reconfiguring, at least one of the captured output signal values and desired output signal values.

18. The method of claim 13, wherein the volatile memory comprises a volatile memory block, and wherein the preserving comprises:
    transferring the at least one data value from the volatile memory block to non-volatile memory prior to the reconfiguring; and
    transferring the at least one data value during the reconfiguring from the non-volatile memory to the volatile memory block.

19. The method of claim 13, further comprising performing a background programming operation of the programmable logic device prior to the reconfiguring.

20. The method of claim 13, further comprising altering at least one of the captured input/output states prior to providing during the reconfiguring.

21. The method of claim 13, further comprising preserving at least one user register value and at least one input/output personality through the reconfiguring.

* * * * *